United States Patent
Lee et al.

(10) Patent No.: US 10,459,021 B2
(45) Date of Patent: Oct. 29, 2019

(54) SYSTEMS AND METHODS FOR DETECTING DEFECTS IN AN ANTENNA ARRAY AND/OR IN A DEVICE COUPLED TO THE ANTENNA ARRAY

(71) Applicant: Keysight Technologies, Inc., Minneapolis, MN (US)

(72) Inventors: Gregory Steven Lee, Mountain View, CA (US); Christopher L. Coleman, San Jose, CA (US); Gregory Douglas VanWiggeren, San Jose, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 427 days.

(21) Appl. No.: 15/268,016

(22) Filed: Sep. 16, 2016

(65) Prior Publication Data

US 2018/0080967 A1 Mar. 22, 2018

(51) Int. Cl.
*G01R 29/10* (2006.01)
(52) U.S. Cl.
CPC .................................. *G01R 29/10* (2013.01)
(58) Field of Classification Search
None
See application file for complete search history.

(56) References Cited

U.S. PATENT DOCUMENTS

| | | | |
|---|---|---|---|
| 6,285,330 B1 * | 9/2001 | Perl | G01R 29/10 342/360 |
| 8,325,098 B1 * | 12/2012 | Henrie | G01R 29/10 324/632 |
| 2010/0207827 A1 * | 8/2010 | Oh | G01R 29/10 343/703 |
| 2013/0093447 A1 * | 4/2013 | Nickel | H04W 24/06 324/750.16 |
| 2015/0017928 A1 * | 1/2015 | Griesing | H04B 17/0085 455/67.14 |

OTHER PUBLICATIONS

Alvarez et al., The Sources Reconstruction Method for Antenna Diagnostics and Imaging Applications, InTech, Creative Commons Attribution License, Chp 6 (Year: 2012).*
Pierri et al., A Two Probes Scanning Phaseless Near-Field Far-Field Transformation Technique, IEEE Transaction on Antennas and Propagation, vol. 47, No. 5 (Year: 1999).*

* cited by examiner

Primary Examiner — Roy Y Yi

(57) ABSTRACT

Various illustrative embodiments disclosed herein generally pertain to detecting defects by using a radio-frequency debugging signal transmitted by a transmitting antenna array towards a receiving antenna located in a far-field region of the transmitting antenna array. The radio-frequency debugging signal, which is configured to provide information pertaining to a signal radiation distribution of the transmitting antenna array, is received in the receiving antenna and conveyed to a test unit. The test unit digitizes the received radio-frequency debugging signal to obtain a digital dataset and applies a back-propagation algorithm to the digital dataset for deriving a reconstructed near-field representation of the transmitting array. The reconstructed near-field representation is compared to a signal radiation reference template in order to detect a defective amplitude and/or a defective phase that is indicative of a defect in the transmitting antenna array and/or a device-under-test coupled to the transmitting antenna array.

20 Claims, 10 Drawing Sheets

```
0 1 2 0 1 2 0 1 2 0 1 2        0 2 1 0 2 1 0 2 1 0 2 1
1 2 0 1 2 0 1 2 0 1 2 0        1 0 2 1 0 2 1 0 2 1 0 2
2 0 1 2 0 1 2 0 1 2 0 1        2 1 0 2 1 0 2 1 0 2 1 0
0 1 2 0 1 2 0 1 2 0 1 2        0 2 1 0 2 1 0 2 1 0 2 1
1 2 0 1 2 0 1 2 0 1 2 0        1 0 2 1 0 2 1 0 2 1 0 2
2 0 1 2 0 1 2 0 1 2 0 1        2 1 0 2 1 0 2 1 0 2 1 0
```

$\theta_x = \sin^{-1}(\lambda/3s_x)$  　　　　$\theta_x = -\sin^{-1}(\lambda/3s_x)$
$\theta_y = -\sin^{-1}(\lambda/3s_y)$ 　　　　$\theta_y = -\sin^{-1}(\lambda/3s_y)$

```
0 2 1 0 2 1 0 2 1 0 2 1        0 1 2 0 1 2 0 1 2 0 1 2
2 1 0 2 1 0 2 1 0 2 1 0        2 0 1 2 0 1 2 0 1 2 0 1
1 0 2 1 0 2 1 0 2 1 0 2        1 0 2 1 0 2 1 0 2 1 0 2
0 2 1 0 2 1 0 2 1 0 2 1        0 1 2 0 1 2 0 1 2 0 1 2
2 1 0 2 1 0 2 1 0 2 1 0        2 0 1 2 0 1 2 0 1 2 0 1
1 0 2 1 0 2 1 0 2 1 0 2        1 0 2 1 0 2 1 0 2 1 0 2
```

$\theta_x = -\sin^{-1}(\lambda/3s_x)$ 　　　　$\theta_x = \sin^{-1}(\lambda/3s_x)$
$\theta_y = \sin^{-1}(\lambda/3s_y)$  　　　　$\theta_y = \sin^{-1}(\lambda/3s_y)$

FIG. 14

SYSTEMS AND METHODS FOR DETECTING DEFECTS IN AN ANTENNA ARRAY AND/OR IN A DEVICE COUPLED TO THE ANTENNA ARRAY

BACKGROUND

Microwave and millimeter-wave antennas are becoming increasingly popular and pervasive. Such antennas are incorporated into a wide variety of devices for a wide variety of applications. As a result of the variety, devices that are directed at certain types of applications where size is not a significant concern, can be packaged in a modular manner that allows a user the flexibility to not only use various combination of sub-assemblies but also permits a certain level of access to various internal components of these sub-assemblies. On the other hand, other devices that are directed at applications where small size is preferable, use a highly integrated packaging approach that provides a compact unit but makes it relatively difficult to access internal components of the unit. It can be understood however, that irrespective of the packaging of these devices and their applications, it is desirable for one to have the ability to debug these devices if a problem arises in the use of these devices.

Traditional methods of carrying out such debugging operations upon devices that include a radio-frequency antenna involves a technician using a scanner or a probe to carry out signal measurements in what is known in the art as a near-field radiation region of the radio-frequency antenna. Unfortunately, near-field signal measurements tend to not only be cumbersome to execute but are also prone to providing misleading or erroneous results when carried out incorrectly. The misleading or erroneous results can occur due to various reasons such as when an inexperienced technician uses the scanner or the probe in an improper manner, say by directly touching the probe to the antenna or by orienting the probe incorrectly with respect to the antenna. In some cases, even an experienced technician can obtain misleading or erroneous results by the mere act of introducing a foreign object into the near-field radiation region. For example, in some cases, a probe, when introduced into a near-field region of an antenna can change the radiation characteristic of the antenna and provide signal measurements that do not accurately reflect signal values that would be present in the absence of the probe.

SUMMARY

Certain embodiments of the disclosure can provide a technical effect and/or solution to detect defects in a transmitting antenna array and/or in a device-under-test that uses the transmitting antenna array. As a part of an exemplary defect detection procedure, the transmitting antenna array is configured to transmit a radio-frequency (RF) debugging signal towards a receiving antenna located in a far-field region of the transmitting antenna array. The radio-frequency debugging signal is processed in a test unit coupled to the receiving antenna in order to derive a reconstructed near-field representation of the transmitting antenna array. The reconstructed near-field representation of the transmitting antenna array can be compared against a reference signal radiation template of the transmitting antenna array so as to identify defects in one or more radiating elements of the transmitting antenna array and/or in various elements of the device-under-test that uses the transmitting antenna array.

According to one exemplary embodiment in accordance with the disclosure, a method includes receiving in a receiving antenna, a radio-frequency debugging signal transmitted by a transmitting antenna array, the receiving antenna located in a far-field region of the transmitting antenna array, the transmitting antenna array configured to propagate via the radio-frequency debugging signal, information indicative of a signal radiation distribution of the transmitting antenna array. The method also includes executing a defect detection procedure upon the radio-frequency debugging signal received in the receiving antenna. The defect detection procedure includes obtaining a digital dataset by digitizing the radio-frequency debugging signal received in the receiving antenna; applying a back-propagation algorithm to the digital dataset to derive a reconstructed near-field representation of the transmitting antenna array, the reconstructed near-field representation indicating the signal radiation distribution of the transmitting antenna array; and using the reconstructed near-field representation of the transmitting antenna array to identify at least one of: a) one or more defects in at least one of the transmitting antenna array or a device-under-test coupled to the transmitting antenna array or b) zero defects in at least one of the transmitting antenna array or the device-under-test coupled to the transmitting antenna array.

According to another exemplary embodiment in accordance with the disclosure, a method includes identifying a first set of radiating elements of a transmitting antenna array; identifying a second set of radiating elements of the transmitting antenna array such that each individual radiating element of the second set of radiating elements is located between two or more radiating elements of the first set of radiating elements; and driving the transmitting antenna array with an antenna feed signal formatted in accordance with a debugging code sequence, the debugging code sequence selected at least in part, to configure the first set of radiating elements to transmit a first radio-frequency signal portion having a first signal phase and to configure the second set of radiating elements to transmit a second radio-frequency signal portion having a second signal phase.

According to yet another exemplary embodiment in accordance with the disclosure, a defect detecting system includes a receiving antenna and an element defect detector. The receiving antenna is configured to receive a radio-frequency debugging signal transmitted by a transmitting antenna array, the radio-frequency debugging signal including a first radio-frequency signal component having a first signal phase and a second radio-frequency signal component having a second signal phase, the first signal phase and the second signal phase selected to provide information indicative of a signal radiation distribution of the transmitting antenna array. The element defect detector, which is coupled to the receiving antenna, is configured to execute a defect detecting procedure. The defect detecting procedure includes obtaining a digital dataset by digitizing the radio-frequency debugging signal; applying a back-propagation algorithm to the digital dataset to derive a reconstructed near-field representation of the transmitting antenna array, the reconstructed near-field representation indicating the signal radiation distribution of the transmitting antenna array; and using the reconstructed near-field representation of the transmitting antenna array to identify zero or more defects in at least one of the transmitting antenna array or a device-under-test coupled to the transmitting antenna array.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

FIG. 14 illustrates a few exemplary ternary debugging coding schemes in accordance with the disclosure.

DETAILED DESCRIPTION

Figure 1:
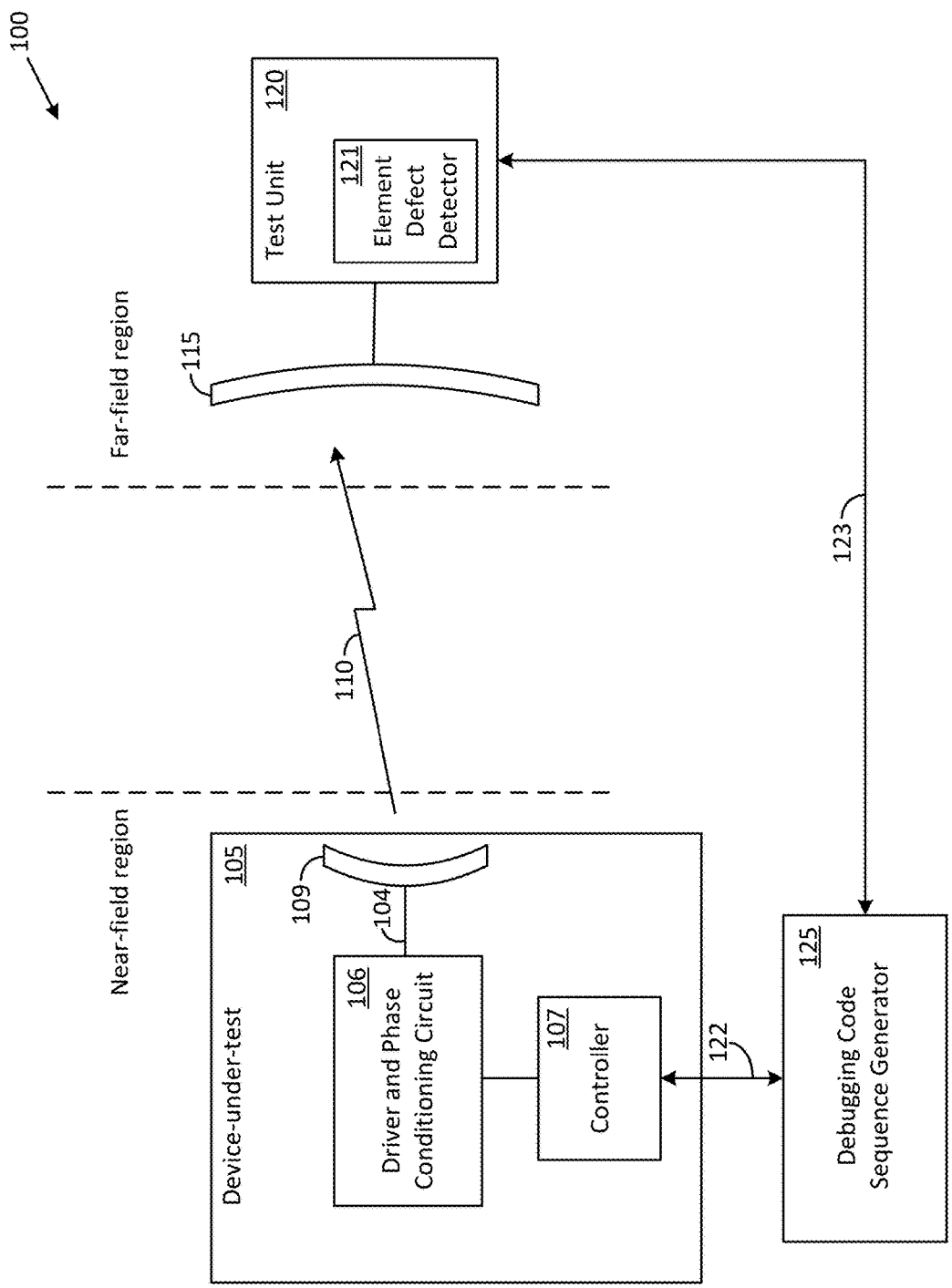
FIG. 1 shows an exemplary embodiment of a defect detecting system that includes a receiving antenna arranged to receive a radio-frequency debugging signal transmitted by a transmitting antenna array in accordance with the disclosure.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words, phrases, and labels are used herein solely for describing some aspects of the disclosure and as such these words, phrases, and labels encompass various other aspects that can be understood by persons of ordinary skill in the art.

For example, the labels "receiving antenna" and "transmitting antenna array" are used herein merely as a matter of convenience to indicate a functional difference between a first antenna configured to execute a signal "receiving" function and a second antenna configured to execute a signal "transmitting" function. However, as can be understood by persons of ordinary skill in the art, antennas are typically passive elements that can be interchangeably and/or simultaneously used for receiving signals as well as for transmitting signals. Consequently, a so-called "receiving antenna" can be used for transmitting signals in various alternative embodiments in accordance with the disclosure and a so-called "transmitting antenna array" can be used for receiving signals in various alternative embodiments in accordance with the disclosure. More particularly, it should be understood that in some instances, one or more radio-frequency signals can be transmitted from the "receiving antenna 115" to the "transmitting antenna array 109" in order to exercise some receiver functions that can include configuring the gain settings of one or more low-noise amplifiers (not shown) in the device-under-test 105 in accordance with the disclosure. As another example, words such as "coupling" and "coupled" as used herein generally indicate a direct or an indirect electrical signal connectivity between two or more elements. Thus, when an antenna array is described as being coupled to a debugging code sequence generator, it should be understood that in some implementations in accordance with the disclosure, the debugging code sequence generator can be directly coupled to the antenna array (for example, when the debugging code sequence generator has appropriate signal driving circuitry built into it), while in some other implementations in accordance with the disclosure, the debugging code sequence generator can be indirectly coupled to the antenna array via one or more other elements such as an amplifier or a signal coupler. Furthermore, the word "connection" as used herein can generally pertain to various types of signal connections carried out by using various types of elements such as a wire, a connector, a track on a printed circuit board, and/or a wireless link (Bluetooth etc.). In some instances, certain words ("device" and "device-under-test"; "portion" and "segment" etc.) may be used interchangeably in various parts of the disclosure. It should be further understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

Attention is now drawn to FIG. 1, which shows an exemplary embodiment of a defect detecting system 100 that includes a receiving antenna 115 arranged to receive a radio-frequency debugging signal 110 transmitted by a transmitting antenna array 109. The radio-frequency debugging signal 110 is provided to the transmitting antenna array 109 by one or more elements of a device-under-test 105. The device-under-test 105 can be any of a wide variety of devices, such as a cellular phone, a radio handset, a wireless communication device, a wi-fi device, a wireless home automation device, an entertainment/gaming device, or an industrial controller. Consequently, in some cases, the transmitting antenna array 109 can be coupled to various elements of the device-under-test 105 inside an integrated package, while in some other cases, the transmitting antenna array 109 can be provided as a separate element that is coupled to the device-under-test 105 via an external coupling link such as a communication cable. Thus, in some applications, the transmitting antenna array 109 can be a strip-line antenna formed on a printed circuit board (PCB) contained inside an enclosure of the device-under-test 105 (a cellular phone, for example) and in some other applications, the transmitting antenna array 109 can be a stand-alone, bulkier element such as a whip antenna that is coupled to the device-under-test 105 via an RF connector.

In the exemplary embodiment shown in FIG. 1, the device-under-test 105 not only includes the transmitting antenna array 109 but also includes a driver and phase conditioning circuit 106 and a controller 107. The controller 107 configures the driver and phase conditioning circuit 106 to drive an antenna feed signal 104 into the transmitting antenna array 109 for transmitting the radio-frequency debugging signal 110 in a format that includes one or more predefined signal phases used to execute a defect detection procedure in accordance with the disclosure.

The defect detecting system 100 also includes a debugging code sequence generator 125, which communicates with the controller 107 via a communication link 122 to provide a debugging code sequence that is used by the driver and phase conditioning circuit 106 to determine signal phase values for generating the antenna feed signal 104. The debugging code sequence generator 125 can be implemented in various ways. In a first exemplary implementation, the debugging code sequence generator 125 can be a part of a test unit 120 that is independent of other elements such as the device-under-test 105 of the defect detecting system 100, thereby allowing the test unit 120 to be manufactured, owned, operated, and/or maintained, by an entity other than an entity associated with the device-under-test 105. However, in a second exemplary implementation, the debugging code sequence generator 125 can be a part of the device-under-test 105 and can thus be operated for example, on an as-needed basis, by an operator of the device-under-test 105.

The communication link 122 and/or another communication link 123, one or both of which can be implemented and used in accordance with the nature of the packaging of the debugging code sequence generator 125, can include one or more wireless elements (Bluetooth, for example), optical elements (laser transmitter and optical receiver, for example), and/or wired elements (cable, for example). In the example embodiment shown in FIG. 1, the debugging code sequence generator 125, which is packaged separately from the test unit 120, is communicatively coupled to the test unit 120 via the communication link 123 that can be used for transferring information, messages, and/or data between the test unit 120 and the debugging code sequence generator 125. For example, the communication link 122 can be used by an element defect detector 121 of the test unit 120 to provide one or more debugging code sequences to the debugging code sequence generator 125 and/or to instruct the debugging code sequence generator 125 to use a particular debugging code sequence that is preferred by a user of the test unit 120 and/or the device-under-test 105.

As shown in FIG. 1, an area located near a radio-frequency signal radiating surface of the transmitting antenna array 109 is referred to as a near-field region. Various characteristics of the near-field region are known in the art and will not be elaborated upon herein so as to avoid distracting from certain other aspects in accordance with the disclosure. The receiving antenna 115 is arranged in a far-field region of the transmitting antenna array 109. Various characteristics of the far-field region are also known in the art and will not be elaborated upon herein so as to avoid distracting from certain other aspects in accordance with the disclosure.

In the far-field region, the receiving antenna 115 is coupled to the test unit 120, which can be collocated with the receiving antenna 115 inside an integrated enclosure in some example implementations in accordance with the disclosure. The receiving antenna 115 can be one of various types of antennas and can include a planar signal reception surface and/or a curved signal reception surface. The receiving antenna 115 is configured to receive at least a portion of the radio-frequency signal 110 and provide this portion of the radio-frequency signal 110 to the test unit 120 for executing defect detection procedures in accordance with the disclosure. Towards this end, the test unit 120 incorporates the element defect detector 121, which can include a computer for executing various operations pertaining to detecting defects in accordance with the disclosure. As such, the computer can include a processor coupled to non-transitory computer-readable storage media (one or more memory devices) used for storing computer-executable instructions to implement various method steps disclosed herein and/or for storing one or more debugging code sequences that can be used by the device-under-test 105 for executing a defect detect procedure in accordance with the disclosure.

Figure 2:
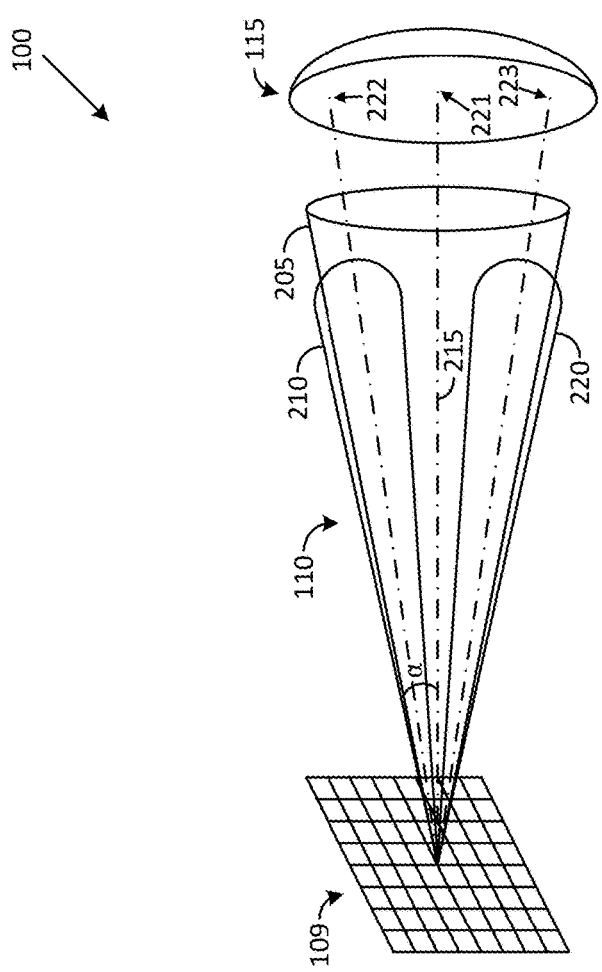
FIG. 2 shows the transmitting antenna array transmitting the radio-frequency debugging signal towards the receiving antenna using a cone angle of signal transmission that is selected in accordance with the disclosure.

Attention is next drawn to FIG. 2, which shows the transmitting antenna array 109 transmitting the radio-frequency debugging signal 110 towards the receiving antenna 115. The transmitting antenna array 109 includes a number of radiating elements (indicated by a grid pattern) configured to receive the antenna feed signal 104 from the driver and phase conditioning circuit 106 and to transmit the radio-frequency debugging signal 110 using a cone angle of signal transmission 205 that is selected on the basis of various considerations in accordance with the disclosure. The cone angle of signal transmission 205 can be defined in various ways, such as by an angle $\alpha$ with respect to a signal transmission axis 215.

In the exemplary implementation shown in FIG. 2, the radio-frequency debugging signal 110 is transmitted in the form of two side lobes that are substantially confined inside the cone angle of signal transmission 205. More particularly, the two side lobes are used for transmitting the radio-frequency debugging signal 110 in a format that provides for signal phase to be detected by the test unit 120 in various portions of the radio-frequency debugging signal 110. Thus, the radio-frequency debugging signal 110 can be used to propagate a signal portion having a first signal phase (0 degrees, for example) that is associated with a first set of radiating elements of the transmitting antenna array 109 and another signal portion having a second signal phase (180 degrees, for example) that is associated with a second set of radiating elements of the transmitting antenna array 109. In other exemplary implementations in accordance with the disclosure, more than two side lobes can be used to propagate the radio-frequency debugging signal 110. The number of side lobes present in the radio-frequency debugging signal 110 depends upon certain characteristics of the transmitting antenna array 109, such as a spacing between radiating elements, and also upon the type of debugging code sequence used by the driver and phase conditioning circuit 106.

The manner in which the radio-frequency debugging signal 110 is incident upon the receiving antenna 115 is dependent on the number of side lobes and the cone angle of signal transmission used by the transmitting antenna array 109 to transmit the radio-frequency debugging signal 110. In the example implementation shown in FIG. 2, a first side lobe 210 of the radio-frequency debugging signal 110 is primarily incident upon a location 222 of the receiving antenna 115 and a second side lobe 220 of the radio-frequency debugging signal 110 is primarily incident upon a location 223 of the receiving antenna 115. As a result of this arrangement, the signal amplitudes of the radio-frequency debugging signal 110 incident upon the location 222 and the location 223 are substantially greater than a signal amplitude of the radio-frequency debugging signal 110 incident upon a location 221 of the receiving antenna 115.

Figure 3:
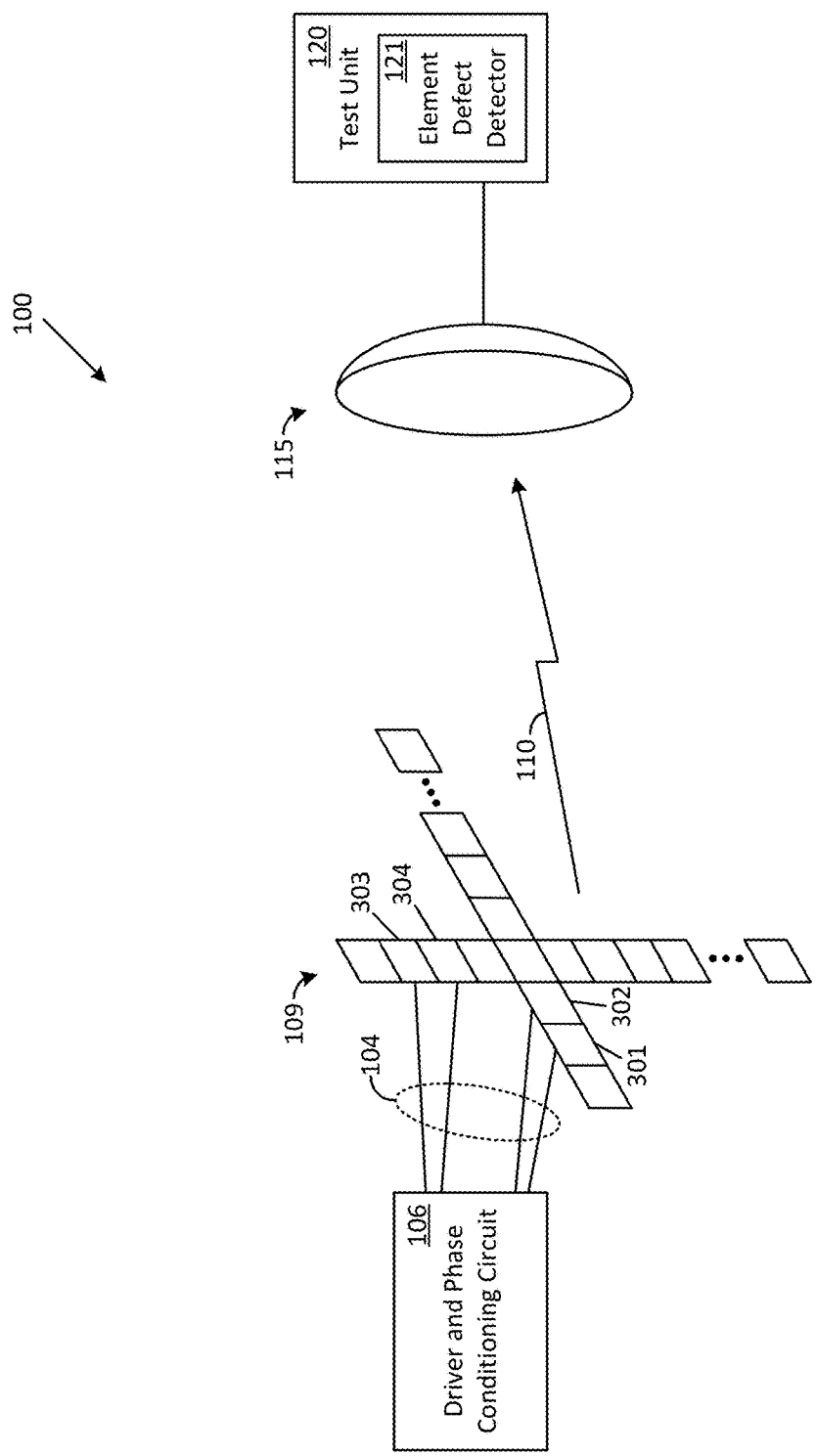
FIG. 3 shows an exemplary antenna signal feed arrangement for transmitting the radio-frequency debugging signal from the transmitting antenna array towards the receiving antenna in accordance with the disclosure.

FIG. 3 shows an exemplary antenna signal feed arrangement for transmitting the radio-frequency debugging signal 110 from the transmitting antenna array 109 towards the receiving antenna 115 in accordance with the disclosure. In this exemplary antenna signal feed arrangement, a first portion of the antenna feed signal 104 drives some or all radiating elements of one or more selected columns (only one column shown for clarity) to transmit a first set of signal segments having a first signal phase. Thus, radiating elements such as radiating element 303 and radiating element 304 transmit respective signal segments having the first signal phase. A second portion of the antenna feed signal 104 drives some or all radiating elements of one or more selected rows (only one row shown for clarity) to transmit a second set of signal segments having a second signal phase. Thus, radiating element such as radiating element 301 and radiating element 302 transmit respective signal segments having the second signal phase. The first set of signal segments having the first signal phase and the second set of signal segments having the second signal phase collectively constitute the radio-frequency debugging signal 110 that is transmitted by the transmitting antenna array 109 towards the receiving antenna 115.

Figure 4:
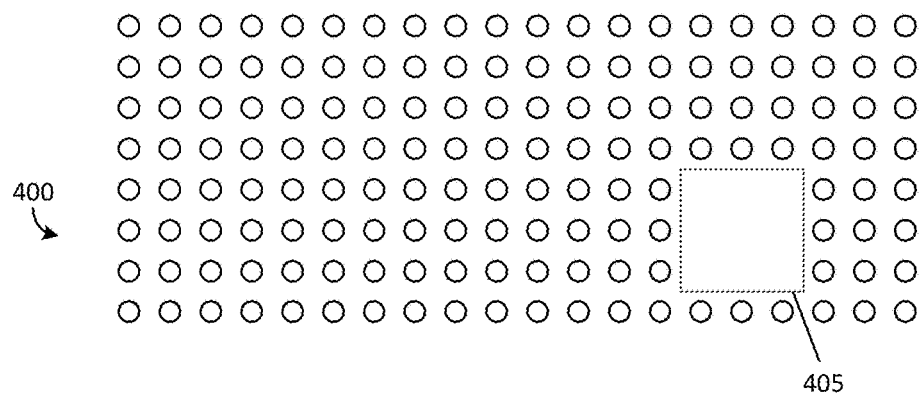
FIG. 4 shows a first exemplary signal radiation distribution of the transmitting antenna array, the signal radiation distribution indicative of a set of defective radiating elements.

FIG. 4 shows a first exemplary signal radiation distribution 400 of the transmitting antenna array 109. The signal radiation distribution 400 has a matrix format that includes a number of rows and a number of columns with each element of the matrix representing signal radiation by an individual radiating element of the transmitting antenna array 109. The spacing between any two adjacent radiating elements can be $\geq \lambda/2$ in some exemplary embodiments, and can be as large as $\lambda$ in some other exemplary embodiments, where $\lambda$ corresponds to a wavelength of the radio-frequency debugging signal 110.

In this example, every radiating element of the transmitting antenna array 109 transmits a signal having an identical signal phase. The dashed box 405 indicates a 3×3 set of zero signal amplitudes that is indicative of a 3×3 set of defective radiating elements and/or indicative of defective elements connected to the 3×3 set of defective radiating elements.

Figure 5:
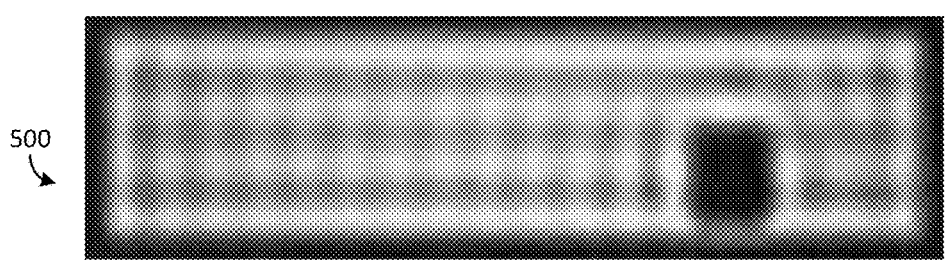
FIG. 5 shows an exemplary reconstructed near-field representation of the transmitting antenna array corresponding to the first exemplary signal radiation distribution in accordance with the disclosure.

FIG. 5 shows an exemplary reconstructed near-field representation 500 of the transmitting antenna array 109 corresponding to the first exemplary signal radiation distribution 400. The reconstructed near-field representation 500 can be generated by configuring the transmitting antenna array 109 to transmit the radio-frequency debugging signal 110 in an exemplary 30° cone angle of signal transmission and by using the element defect detector 121 to execute a defect detecting procedure in accordance with the disclosure. Further details about some exemplary defect detecting procedures will be provided below using other figures.

It can be observed from FIG. 5, that the use of the 30° cone angle of signal transmission for transmitting the radio-frequency debugging signal 110 in accordance with the exemplary signal radiation distribution 400 (i.e., every radiating element of the transmitting antenna array 109 transmitting a signal having identical signal phase) leads to a blurry reconstructed near-field representation 500. Consequently, even if one were to recognize an anomaly in the reconstructed near-field representation 500, it can be difficult to unambiguously identify the 3×3 set of defective radiating elements that are causing the anomaly, let alone unambiguously identify a single radiating element if only one radiating element (rather than 9) was defective. It is therefore generally desirable to modify the characteristics of the signal radiation distribution 400 and/or the cone angle of signal transmission in order to generate a reconstructed near-field representation that provides better resolution than the reconstructed near-field representation 500.

Figure 6:
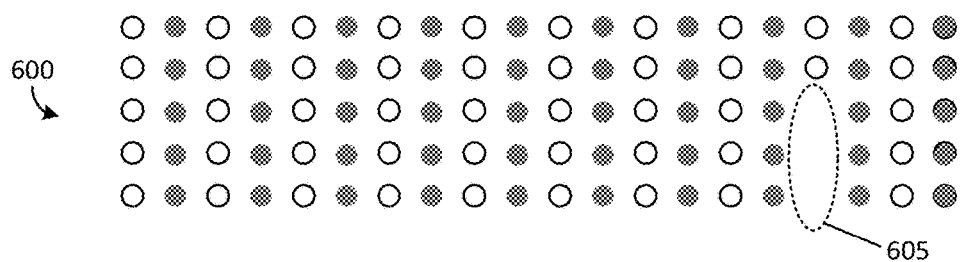
FIG. 6 shows a second exemplary signal radiation distribution of the transmitting antenna array, the signal radiation distribution indicative of a set of defective radiating elements in a column.

Keeping in mind the desirability to modify the characteristics of the signal radiation distribution 400, attention is next drawn to FIG. 6, which shows a second exemplary signal radiation distribution 600 of the transmitting antenna array 109. For comparison purposes in this description, the signal radiation distribution 600 has a matrix format that is similar to the signal radiation distribution 400 and includes a number of rows and a number of columns. Each element of the matrix represents signal radiation by an individual radiating element of the transmitting antenna array 109. In this exemplary implementation, the spacing between any two adjacent radiating elements of the matrix is selected to be $\geq \lambda/2$, where $\lambda$ corresponds to a wavelength of the radio-frequency debugging signal 110. The spacing can be explicitly selected on the basis of a cone angle of signal transmission that is less than 90°, such as a 30° cone angle of signal transmission.

Unlike the exemplary signal radiation distribution 400, where every radiating element of the transmitting antenna array 109 is configured to transmit a signal having an identical signal phase, in the exemplary signal radiation distribution 600, the radiating elements of every odd-numbered column of the matrix transmits a signal having a first signal phase. The radiating elements of every even-numbered column transmit a signal having a second signal phase. If the first signal phase is 0° for example, and the second signal phase is 180°, every radiating element in the odd-numbered columns (first, third, fifth, and so on) transmits a signal having a 0° signal phase and every radiating element in the even-numbered columns (second, fourth, sixth, and so on) transmits a signal having a 180° signal phase. This arrangement wherein two different signal phases are used upon any two adjacent columns of the matrix is generally referred to herein as a binary anti-phasing coding arrangement. The binary anti-phasing coding arrangement that is used upon two adjacent columns can be extended to other arrangements beyond the binary anti-phasing coding arrangement such as a ternary distributed-phase coding arrangement where three signal phases are used (0°, 120°, and 240°, for example) upon three adjacent columns, a quaternary distributed-phase arrangement where four signal phases are used, and so on.

The various phase coding arrangements can be implemented in a variety of ways using various phase modulation formats. For example, some implementations in accordance with the disclosure, can be based on individual preferences of various vendors and/or manufacturers of the device-under-test 105. Thus, in one exemplary implementation, a manufacturer of the device-under-test 105 may opt to incorporate one or more monolithic integrated circuit (MMIC) digital phase shifters into the driver and phase conditioning circuit 106, for executing the phase conditioning functionality in accordance with the disclosure. As is known, a MMIC digital phase shifter generates a phase-shifted radio-frequency signal on the basis of a digital code word. In this exemplary implementation, the digital code word is the binary debugging code sequence generated by the debugging code sequence generator 125 and provided to the driver and phase conditioning circuit 106 via signal driving circuitry included in the controller 107. One or more of the phase-shifted radio-frequency signals that are obtained by using the one or more MMIC digital phase shifters, constitute the antenna feed signal 104. The antenna feed signal 104 can be driven into the various radio-frequency signal radiating elements of the transmitting antenna array 109 by one or more driver amplifiers provided in the driver and phase conditioning circuit 106.

Furthermore, the various coding arrangements are generally directed at formatting the radio-frequency debugging signal 110 into multiple side lobes that carry signal phase information. It is preferable in accordance with the disclosure, to confine all or at least a significant portion, of each of the multiple side lobes of the radio-frequency debugging signal 110 inside a pre-defined cone angle of signal transmission.

When the binary anti-phasing coding arrangement is used, the signal transmission axis of each of the two side lobes can be defined by the following equation:

$$\theta = \pm \sin^{-1}(\lambda/2\ s) \qquad \text{Equation (1)}$$

where $\sin^{-1}$ is an arcsine function, $\lambda$ is the wavelength used for transmitting the radio-frequency debugging signal 110, and "s" is a spacing parameter. The use of Equation (1) ensures that a strong field radiation is made available in the far-field region of the transmitting antenna array 109. Thus, for arrays with $s=\lambda$, a far field signal scan range of $\pm 30°$ can be adequate to obtain a reconstructed near-field representation of the transmitting antenna array 109 that can be used to identify defects down to a granularity of a single radiating element.

Using an anti-phasing coding arrangement in a column-oriented format as indicated by the second exemplary signal radiation distribution 600, readily accommodates detection of defects that occur along one or more columns. Thus, for example, using the column-oriented anti-phasing coding arrangement allows for easier detection of the set of three defective radiating elements that exist along a column of the second exemplary signal radiation distribution 600 (identified by the dashed line oval 605).

Figure 7:
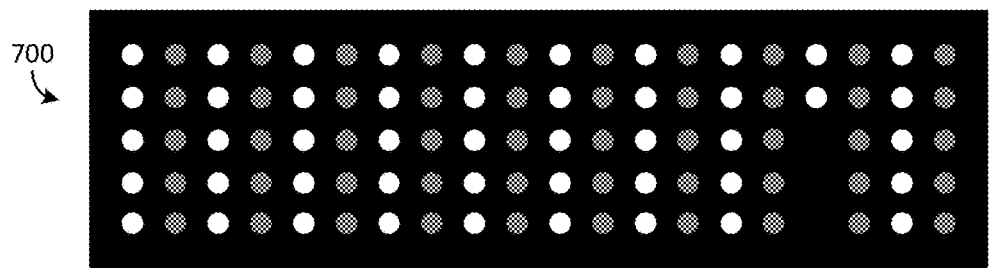
FIG. 7 shows a reconstructed near-field representation of the transmitting antenna array corresponding to the second exemplary signal radiation distribution in accordance with the disclosure.

FIG. 7 shows an exemplary reconstructed near-field representation 700 of the transmitting antenna array 109 corresponding to the second exemplary signal radiation distribution 600. The exemplary reconstructed near-field representation 700, which is clear and relatively easy to interpret due to in part due to the absence of blurring in the horizontal direction, can be used to identify the three defective radiating elements that are identified by the dashed line oval 605 in FIG. 6. It should be understood that in some embodiments, the exemplary reconstructed near-field representation 700 can be used to verify that the transmitting antenna array 109 has no defective radiating elements.

Drawing attention back to FIG. 1 momentarily, the debugging code sequence generator 125 can use ones and zeros to execute the binary, ternary, and quaternary coding arrangements referred to above, and can also use other types of codes to allow the use of coding with a different periodicity.

In one exemplary implementation in accordance with the invention, the debugging code sequence generator 125 can provide to the driver and phase conditioning unit 106, a Walsh-Hadamard code sequence that is used to generate the antenna feed signal 104 fed by the driver and phase conditioning circuit 106 into the various radio-frequency signal radiating elements of the transmitting antenna array 109 for transmitting the radio-frequency debugging signal 110.

Typically, a Walsh-Hadamard code sequence looks like a periodic string of ones and zeros with a block length and shift factor determined by the nature of a selected code sequence. In accordance with the disclosure, each binary bit "0" of the Walsh-Hadamard code sequence (as well as any other code sequence) can be used for example to represent 0° signal phase and each binary bit "1" can be used for example to represent 180° signal phase in a binary anti-phasing coding arrangement. The various lengths of repetitive blocks that characterize the Walsh-Hadamard code sequence can be viewed as a set of super-spacing "S" that is related to the spacing parameter "s" of Equation (1) in the following manner:

$$S = n \times s \qquad \text{Equation (2)}$$

where "n" is the Hadamard sequence block length. For example, in the code sequence 0000111100001111, the Hadamard sequence block length n=4. The signal phases transmitted in the side lobes depends on the Walsh-Hadamard code shift factor because of the well-known Fourier shift theorem. For example, 0011110000111100 is a shifted (and digitally orthogonal) version of the code 0000111100001111. These two code sequences (when used to create the antenna feed signal 104) produce identical far field power patterns but with differing signal phase patterns that differ by a signal phase gradient that is a function of an angular direction cosine that varies due to the Fourier shift theorem.

In general, barring the case where the code sequence is a trivial code sequence (i.e., all zeros or all ones), the radio-frequency debugging signal 110 is transmitted in the form of side lobes having an angular transmission direction characterized by the following equation:

$$\theta = \pm \sin^{-1}(\lambda/2\ S) = \pm \sin^{-1}(\lambda/2\ ns) \qquad \text{Equation (3)}$$

The Walsh-Hadamard code sequences tend to be particularly appealing when the cone angle of signal transmission is very limited in certain applications. In high 2D resolution applications, the product of two Walsh-Hadamard code sequences can be used to transmit the radio-frequency debugging signal 110 in both of an x-direction and a y-direction. In certain applications where the transmitting antenna array 109 is an 8×8 array or larger, there exist Walsh codes that are not strictly periodic in nature. For example, six of a set of eight Walsh-Hadamard code sequences are strictly periodic in nature, while two others are aperiodic. The aperiodic codes have bit-flipped subsequences that maintain a certain periodicity. Slightly irregular far field patterns can be produced when aperiodic code sequences are used to generate the radio-frequency debugging signal 110. These irregular far field patterns can prove useful in some debugging applications in accordance with the disclosure.

Figure 8:
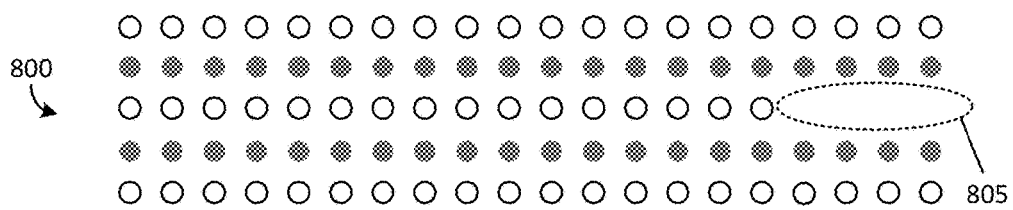
FIG. 8 shows a third exemplary signal radiation distribution of the transmitting antenna array, the signal radiation distribution indicative of a set of defective radiating elements in a row.

Attention is next drawn to FIG. 8, which shows a third exemplary signal radiation distribution 800 of the transmitting antenna array 109. In contrast to the second exemplary signal radiation distribution 600 that uses a column-oriented binary anti-phasing coding arrangement, the third exemplary signal radiation distribution 800 uses a row-oriented binary anti-phasing coding arrangement. The binary anti-phasing coding arrangement that is used upon two adjacent rows can be extended to other arrangements beyond the binary anti-phasing coding arrangement such as a ternary distributed-phase coding arrangement where three signal phases are used (0°, 120°, and 240°, for example) upon three adjacent rows, a quaternary distributed-phase arrangement where four signal phases are used, and so on.

Figure 9:
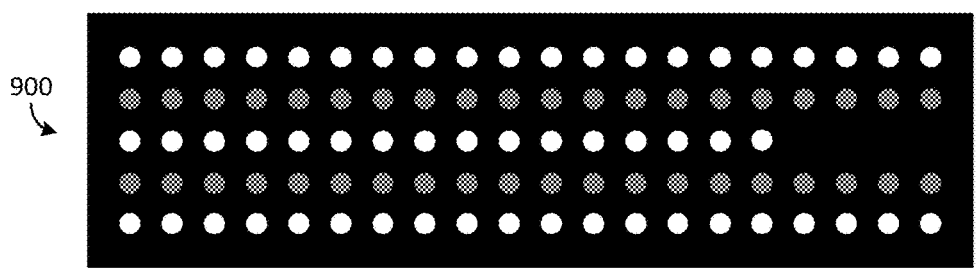
FIG. 9 shows a reconstructed near-field representation of the transmitting antenna array corresponding to the third exemplary signal radiation distribution in accordance with the disclosure.

FIG. 9 shows an exemplary reconstructed near-field representation 900 of the transmitting antenna array 109 corresponding to the third exemplary signal radiation distribution 800. The exemplary reconstructed near-field representation 900 is clear and relatively easy to interpret due to in part due to the absence of blurring in the vertical direction. Thus, for example, using the row-oriented anti-phasing coding arrangement allows for easier detection of the set of three defective radiating elements that exist along a row of the third exemplary signal radiation distribution 800 (identified by the dashed line oval 805). It should be understood that in some embodiments, the exemplary reconstructed near-field representation 900 can be used to verify that the transmitting antenna array 109 has no defective radiating elements.

Figure 10:
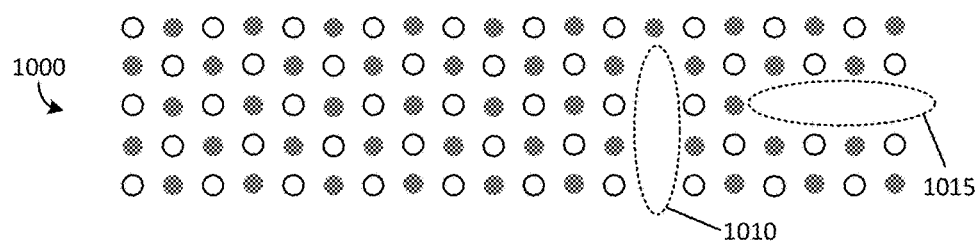
FIG. 10 shows a fourth exemplary signal radiation distribution of the transmitting antenna array, the signal radiation distribution indicative of a first set of defective radiating elements in a row and a second set of defective elements in a column.

FIG. 10 shows a fourth exemplary signal radiation distribution 1000 of the transmitting antenna array 109. In contrast to the second exemplary signal radiation distribution 600 that uses a column-oriented binary anti-phasing coding arrangement and the third exemplary signal radiation distribution 800 that uses a row-oriented binary anti-phasing coding arrangement, the fourth exemplary signal radiation distribution 1000 uses a combination of a column-oriented binary anti-phasing coding arrangement and a row-oriented binary anti-phasing coding arrangement.

Figure 11:
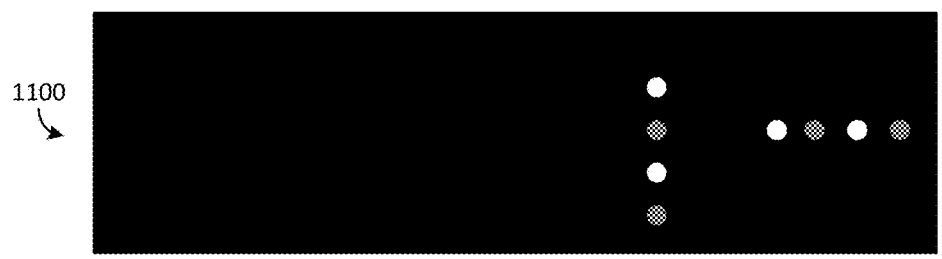
FIG. 11 shows a reconstructed near-field representation of the transmitting antenna array corresponding to the fourth exemplary signal radiation distribution in accordance with the disclosure.

FIG. 11 shows an exemplary reconstructed near-field representation 1100 of the transmitting antenna array 109 corresponding to the fourth exemplary signal radiation distribution 1000. The exemplary reconstructed near-field representation 1100 is clear and relatively easy to interpret due in part due to the absence of blurring in both the vertical direction and the horizontal direction and also in part due to the reconstructed near-field representation 1100 being used to identify only defective radiating elements while ignoring radiating elements having no defects. Thus, for example, it is easier to detect both of a first set of four defective radiating elements that exist along a row of the fourth exemplary signal radiation distribution 1000 (identified by the dashed line oval 1015) and a second set of four defective radiating elements that exist along a column of the fourth exemplary signal radiation distribution 1000 (identified by the dashed line oval 1010). It should be understood that in some embodiments, the exemplary reconstructed near-field representation 1100 can be used to verify that the transmitting antenna array 109 has no defective radiating elements.

Figure 12:
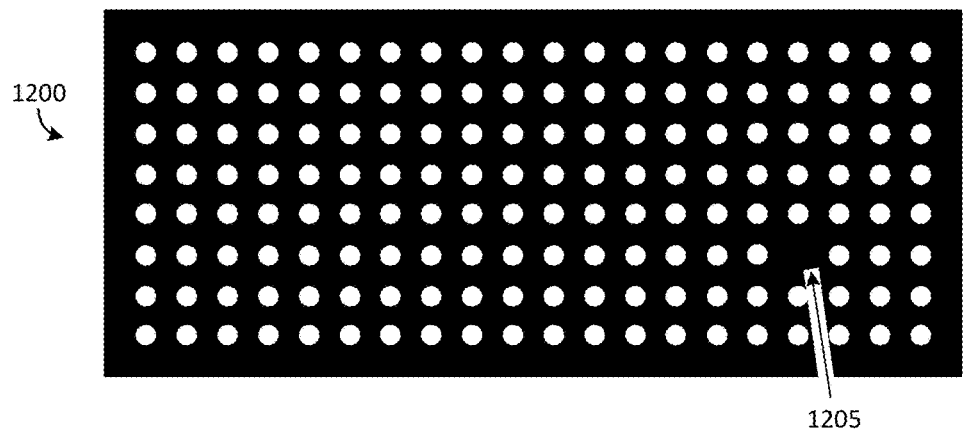
FIG. 12 shows a reconstructed near-field representation of an exemplary transmitting antenna array when the radio-frequency debugging signal is transmitted using an exemplary wide-angle cone angle of signal transmission in accordance with the disclosure.

FIG. 12 shows a reconstructed near-field representation 1200 of the transmitting antenna array 109 when the radio-frequency debugging signal 110 is transmitted using an exemplary wide-angle cone angle of signal transmission 205 in accordance with the disclosure. More particularly, the exemplary wide-angle cone angle of signal transmission 205 is substantially equal to 90° (i.e., $\alpha \approx 90°$) and the transmitting antenna array 109 is configured to transmit the radio-frequency debugging signal 110 in accordance with the exemplary signal radiation distribution 400 shown in FIG. 4. In this configuration, each individual radiating element of the transmitting antenna array 109 transmits a signal having identical signal phase.

The receiving antenna 115 is configured to receive substantially all of the radio-frequency debugging signal 110, thus advantageously enabling defect detection down to a granularity of a single radiating element of the transmitting antenna array 109. The receiving antenna 115 for receiving the wide-angle cone angle of signal transmission 205 ($\alpha \approx 90°$) can be implemented in various ways. For example, in one implementation in accordance with the disclosure, the receiving antenna 115 can be a hemispherical structure that is used as a dome to partially, or fully, cover the device-under-test 105. The inner surface of the hemispherical structure houses the signal receiving elements, and the dimensions (such as a diameter) of the hemispherical structure can be selected such that the signal receiving elements are located in the far-field region of the transmitting antenna array 109.

The reconstructed near-field representation 1200 of the transmitting antenna array 109 can be obtained in an alternative implementation in accordance with the disclosure wherein the receiving antenna 115 is placed in a stationary condition and the transmitting antenna array 109 is configured to transmit the radio-frequency debugging signal 110 in a sweep mode of operation (by mounting the transmitting antenna array 109 on a gimbal mount, for example). The sweep mode of operation ensures that the radio-frequency debugging signal 110 is automatically swept across the signal reception surface of the stationary receiving antenna 115 and can thus eliminate the need to use the wide-angle cone angle of signal transmission 205 ($\alpha \approx 90°$).

Figure 13:
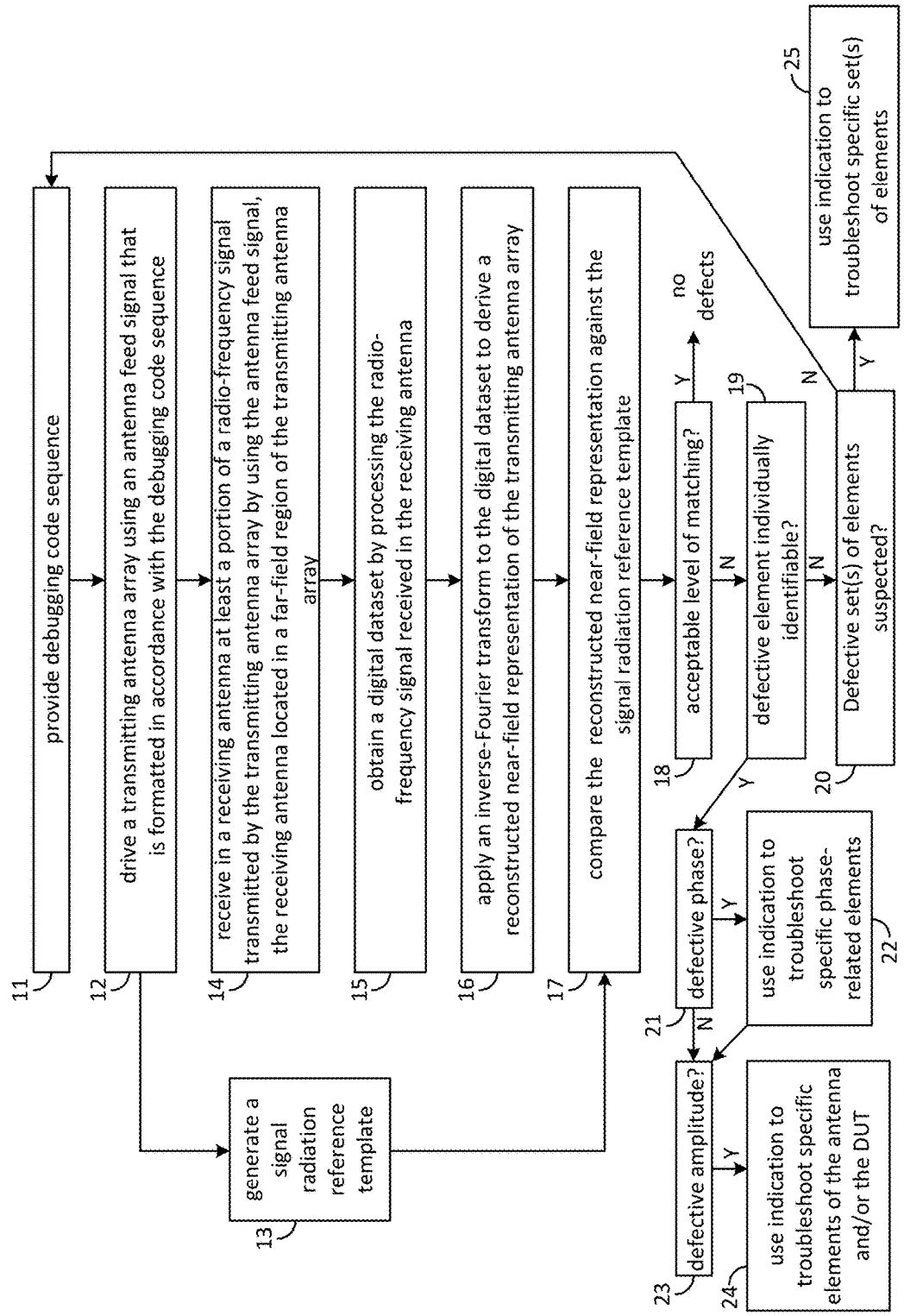
FIG. 13 shows a flowchart of an exemplary defect detecting procedure in accordance with the disclosure.

Attention is now drawn to FIG. 13, which shows a flowchart of an exemplary defect detecting procedure in accordance with the disclosure. The flowchart will be described using reference numerals of the various elements shown in some other figures (such as FIGS. 1-3) as a matter of convenience. It should however be understood that the flowchart is applicable to many other configurations and implementations in accordance with the disclosure. It should also be understood that some of the blocks shown in FIG. 13 can be executed by using a computer of the element defect detector 121, while some other blocks (such as the troubleshooting blocks) can be executed manually by a technician, for example.

In block 11, a debugging code sequence is provided. This operation can be carried out in various ways. In one example implementation, a manufacturer of the device-under-test 105 provides the debugging code sequence generator 125 in the form of a memory device or a database. The memory or database, which can be configured by the manufacturer and/or by another entity, can contain one or more debugging code sequences that are selectable by a user of the device-under-test 105. In another example implementation, the test unit 120 uses the communication link 123 to communicate with the debugging code sequence generator 125 for providing one or more debugging code sequences.

In block 12, the selected debugging code sequence is used by the driver and phase conditioning circuit 106 for generating the input signal 104 that is provided to the transmitting antenna array 109 using the antenna feed signal 104. The transmitting antenna array 109 in turn transmits the radio-frequency debugging signal 110 formatted according to the antenna feed signal 104. In block 14, at least a portion of the radio-frequency debugging signal 110 is received in the receiving antenna 115 that is located in a far-field region of the transmitting antenna array 109. The amplitude of the radio-frequency debugging signal 110 received in the receiving antenna 115 is dependent upon various factors such as the cone angle of signal transmission 205. In some implementations, where the cone angle of signal transmission 205 is <90° some portions of the side lobes may not be incident upon the receiving antenna 115 and consequently, the receiving antenna 115 receives only a portion of the radio-frequency debugging signal 110.

In block 15, the radio-frequency debugging signal 110 received in the receiving antenna 115 is processed to obtain a digital dataset. The process for converting a signal received in an antenna into a digital dataset (using down conversion to an intermediate frequency (IF), digitizing the IF signal by using an analog-to-digital converter etc.) is known in the art and will not be elaborated upon herein so as to avoid distracting from certain other aspects in accordance with the disclosure.

In block 16, one or more back-propagation algorithms can be applied to the digital dataset for generating a reconstructed near-field representation of the transmitting antenna array 109 (such as in the example embodiments described above with reference to FIGS. 7, 9, 11 and 12). A few exemplary back-propagation algorithms that can be used for this purpose can include an inverse Fourier transform, a convolution, a Fraunhofer propagation algorithm, a Fresnel propagation algorithm, a Rayleigh-Sommerfeld propagation algorithm, an Angular Spectrum propagation algorithm, or a partial differential equation solver (such as a Finite Element Method (FEM) and/or a Finite Difference Method (FDM)). In an exemplary embodiment in accordance with the disclosure, at least some aspects of block 16 can be implemented by a digital signal processor (DSP) that can be a part of the computer in the element defect detector 121. The DSP can be configured to receive the digital dataset from one or more digitizers (analog-to-digital converters, for example) that are also provided in the element defect detector 121 for digitizing the radio-frequency debugging signal 110 received by the receiving antenna 115.

In some implementations in accordance with the disclosure, the reconstructed near-field representation can be provided in the form of an image that provides amplitude information pertaining to the various radiating elements of the transmitting antenna array 109. In some other implementations in accordance with the disclosure, the reconstructed near-field representation can be provided in the form of an image that provides signal phase information pertaining to the various radiating elements of the transmitting antenna array 109. In yet some other implementations in accordance with the disclosure, the reconstructed near-field representation can be provided in the form of an image that provides signal phase information in combination with phase information pertaining to the various radiating elements of the transmitting antenna array 109.

The reconstructed near-field representation of the transmitting antenna array 109 can be used to identify one or more defects in the transmitting antenna array 109 and/or the device-under-test 105. In one exemplary embodiment, which is indicated in block 17, the one or more defects can be identified by comparing the reconstructed near-field representation against a signal radiation reference template. Referring back to block 12, the signal radiation reference template can be generated in block 13, by using a device-under-test 105 that is ensured to be free of defects, with particular emphasis on ensuring that the transmitting antenna array 109 is free of defects. Alternatively, the signal radiation reference template can be generated in block 13, by using computer simulation.

In block 18, a verification is made to determine a level of matching between the reconstructed near-field representation obtained by executing block 16 and the signal radiation reference template generated in block 13. In some example implementations in accordance with the disclosure, block 18 can include determination of a signal amplitude attribute and/or a signal phase attribute of the various radiating elements of the transmitting antenna 109 that are identifiable in the reconstructed near-field representation. Determination of a signal amplitude attribute can be carried out in various ways. For example, in some cases, a pass-fail approach can be applied by using a threshold signal amplitude value to determine if a radiating element is good or defective. In some other cases, multiple threshold signal amplitude values can be used to determine if a radiating element is good, partially defective, or fully defective. A partially defective radiating element can lead to a reduction in amplitude of a signal transmitted by the defective radiating element of the transmitting antenna array. A defective signal phase attribute in one or more radiating elements can be detected by identifying a mismatch in signal phase information between the reconstructed near-field representation and the signal radiation reference template.

If an acceptable level of matching is obtained, the transmitting antenna array 109 and/or the device-under-test 105 is declared to have zero defects. On the other hand, if the level of matching is unacceptable (for example, when an anomaly is detected in the reconstructed near-field representation of the transmitting antenna array), in block 19 it is determined if a defective element in the transmitting antenna array 109 or in the device-under-test 105 is individually identifiable. If the defective element is not individually identifiable, in block 20, it is determined if a set of elements (or multiple sets of elements) is suspected to be defective. A set of elements can include for example, a combination of one or more radiating elements of the transmitting antenna array 109 and/or one or more other elements of the device-under-test 105. If a set of elements (or multiple sets of elements) is suspected to be defective, troubleshooting of the set(s) of elements is carried out in block 25. However, if in block 20 it is suspected that no sets of elements are defective, a different debugging code sequence can be provided in block 11 and the various blocks succeeding block 11 repeated (recursively, using a plurality of debugging code sequences, in some implementations).

Turning back to block 19, if it is determined that a defective element is individually identifiable, in block 21, a determination is made if a defective signal phase exists in the defective element. If a defective signal phase exists (such as the presence of a 0° signal phase where a 180° signal phase is expected) block 22 can be executed. However, if a defective signal phase does not exist, block 22 can be omitted. It should be understood that block 22 can be executed automatically (by a computer-controlled robot, for example) and/or manually. When block 22 is executed manually, an indication (such as a message or a graphical user interface (GUI) image) can be provided to a technician by a computer that is used to execute the various blocks leading up to block 22. The indication can be tailored to provide to the technician, information such as an identity of an element that can be contributing to the defective signal phase. The technician uses this indication to troubleshoot specific phase-related components in the driver and phase conditioning circuit 106.

If a defective signal phase does not exist upon execution of block 21 (and execution of block 22 if carried out), in block 23, a determination of the existence of a defective amplitude is made. The defective amplitude can not only be indicated in some cases in the form of a total loss of signal (due to a failed radiating element in the transmitting antenna array 109, for example) but in some other cases in the form of a reduction in amplitude of the signal (due to a poor connection or faulty element inside the device-under-test 105, for example).

If a defective signal amplitude exists, block 24 can be executed automatically (by a computer-controlled robot, for example) and/or manually to identify one or more defects in the transmitting antenna array 109 and/or the device-under-test 105. When block 24 is executed manually, an indication (such as a message or a GUI image) can be provided to a technician. The indication can be tailored to provide to the technician, information such as an identity of an element(s) that can be contributing to the defective signal amplitude. The technician uses this indication to troubleshoot specific amplitude-related components in the driver and phase conditioning circuit 106, for example.

The troubleshooting procedure carried out by the technician can be specifically targeted at certain elements of the driver and phase conditioning circuit 106 and/or the device-under-test 105 that can potentially contribute to a degradation or loss of signal amplitude. For example, when the indication provided by block 23 pertains to a particular radiating element in the transmitting antenna array 109, troubleshooting of the radiating element as well as items associated with that specific radiating element (a driver amplifier, a wire, a connector, and/or a solder joint) can be carried out by the technician.

Execution of the exemplary defect detecting procedure indicated by the flowchart in accordance with the disclosure, can not only save time and money by assisting a technician to focus troubleshooting efforts upon specific parts of the transmitting antenna array 109 and/or the device-under-test 105, but can also eliminate certain problems associated with traditional troubleshooting procedures (such as distorting a radiation characteristic of the transmitting antenna array 109 by introducing a probe in the near-field region).

FIG. 14 illustrates an exemplary ternary debugging coding scheme when applied in a few alternative combinations in accordance with the disclosure. In contrast to the binary anti-phasing coding arrangements that can be applied to two adjacent rows and/or columns of a matrix, the ternary debugging coding arrangement can be applied to each of three adjacent rows and/or three adjacent columns of a matrix. This arrangement can be convenient when the number of rows and/or columns of the coding matrix is a multiple of three.

Three signal phases such as 0°, 120°, and 240° can be used to implement the ternary distributed-phase coding arrangement, with the three signal phases applied to each of three adjacent columns, three adjacent rows, or a combination of three adjacent columns and three adjacent rows (i.e., applied in both the vertical and the horizontal directions). Four exemplary implementations in accordance with the disclosure are shown in FIG. 14 for purposes of illustrating the ternary debugging coding scheme.

In contrast to Equation (1) that is applicable to the binary anti-phasing coding arrangement, when the ternary distributed-phase coding arrangement is used for transmitting the radio-frequency debugging signal 110, the signal transmission components in each of the x-axis direction and the y-axis direction are indicated specifically as positive or negative parameters (rather than as the ±parameter shown in Eqn. (1)). The equations that are applicable to each of the four example implementations respectively are shown in FIG. 14.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A method comprising:
   receiving in a receiving antenna, a radio-frequency debugging signal transmitted by a transmitting antenna array to which a device-under-test is coupled, the receiving antenna located in a far-field region of the transmitting antenna array, the transmitting antenna array configured to propagate via the radio-frequency debugging signal, information indicative of a signal radiation distribution of the transmitting antenna array; and
   executing a defect detection procedure upon the radio-frequency debugging signal received in the receiving antenna, the defect detection procedure comprising:
      obtaining a digital dataset by digitizing the radio-frequency debugging signal received in the receiving antenna;
      applying a back-propagation algorithm to the digital dataset to derive a reconstructed near-field representation of the transmitting antenna array, the reconstructed near-field representation indicating the signal radiation distribution of the transmitting antenna array; and
      using the reconstructed near-field representation of the transmitting antenna array, determining whether one or more defects are present in at least one of the transmitting antenna array or the device-under-test coupled to the transmitting antenna array, and identifying the one or more defects in the at least one of the transmitting antenna array or the device-under-test coupled to the transmitting antenna array when it is determined that the one or more defects are present.

2. The method of claim 1, further comprising:
   selecting a first signal phase and a second signal phase for configuring the transmitting antenna array to propagate via the radio-frequency debugging signal, information indicative of the signal radiation distribution of the transmitting antenna array;
   using the first signal phase to configure a first set of radiating elements of the transmitting antenna array to transmit a first portion of the radio-frequency debugging signal having the first signal phase; and
   using the second signal phase to configure a second set of radiating elements of the transmitting antenna array to transmit a second portion of the radio-frequency debugging signal having the second signal phase, each individual radiating element of the second set of radiating elements located between two or more radiating elements of the first set of radiating elements.

3. The method of claim 2, wherein the first signal phase is offset by 180 degrees with respect to the second signal phase, and wherein at least one of the first set of radiating elements or the second set of radiating elements includes each radiating element of at least one of a row or a column of the transmitting antenna array.

4. The method of claim 3, further comprising:
   using a debugging code sequence to configure the first set of radiating elements to transmit the first portion of the radio-frequency debugging signal having the first signal phase and to configure the second set of radiating elements to transmit the second portion of the radio-frequency debugging signal having the second signal phase, the debugging code sequence selected to confine two or more side lobes of the radio-frequency debugging signal inside a pre-defined cone angle of signal transmission of the radio-frequency debugging signal by the transmitting antenna array.

5. The method of claim 2, wherein the first signal phase is identical to the second signal phase.

6. The method of claim 1, wherein the back-propagation algorithm comprises at least one of an inverse Fourier transform, a convolution, a Fraunhofer propagation algorithm, a Fresnel propagation algorithm, a Rayleigh-Sommerfeld propagation algorithm, an Angular Spectrum propagation algorithm, or a partial differential equation solver.

7. The method of claim 1, wherein using the reconstructed near-field representation of the transmitting antenna array to identify the one or more defects in the at least one of the transmitting antenna array or the device-under-test coupled to the transmitting antenna array comprises:
  comparing the reconstructed near-field representation of the transmitting antenna array to a signal radiation reference template of the transmitting antenna array to detect at least one of a defective signal phase or a defective amplitude in the signal radiation distribution of the transmitting antenna array; and
  based on the at least one of the defective signal phase or the defective amplitude, identifying the one or more defects in the at least one of the transmitting antenna array or the device-under-test coupled to the transmitting antenna array.

8. A method comprising:
  identifying a first set of radiating elements of a transmitting antenna array to which a device-under-test is coupled;
  identifying a second set of radiating elements of the transmitting antenna array such that each individual radiating element of the second set of radiating elements is located between two or more radiating elements of the first set of radiating elements; and
  driving the transmitting antenna array with an antenna feed signal formatted in accordance with a debugging code sequence, the debugging code sequence selected at least in part, to configure the first set of radiating elements to transmit a first radio-frequency signal component having a first signal phase and to configure the second set of radiating elements to transmit a second radio-frequency signal component having a second signal phase.

9. The method of claim 8, wherein at least one of the first set of radiating elements or the second set of radiating elements is arranged in accordance with one of a row or a column of the transmitting antenna array and wherein the debugging code sequence comprises a binary code with opposing bits of the binary code corresponding to a respective one of the first signal phase and the second signal phase.

10. The method of claim 8, wherein the first set of radiating elements is arranged in accordance with a row of the transmitting antenna array and the second set of radiating elements is arranged in accordance with a column of the transmitting antenna array.

11. The method of claim 8, wherein the debugging code sequence is a Hadamard code sequence having a sequence block length $\geq \lambda/2$.

12. The method of claim 8, further comprising:
  identifying a third set of radiating elements of the transmitting antenna array, the third set of radiating elements arranged in accordance with the one of a row or a column of the transmitting antenna array and located adjacent to at least one of the first set of radiating elements or the second set of radiating elements; and
  selecting the debugging code sequence to configure the third set of radiating elements to transmit a third radio-frequency signal component having a third signal phase.

13. The method of claim 12, wherein the first signal phase corresponds to 0 degrees, the second signal phase corresponds to 120 degrees, and the third signal phase corresponds to 240 degrees.

14. The method of claim 8, wherein the first signal phase corresponds to 0 degrees and the second signal phase corresponds to 180 degrees, and wherein the debugging code sequence is further selected to confine two or more side lobes of a radio-frequency debugging signal inside a pre-defined cone angle of signal transmission, the radio-frequency debugging signal comprising the first radio-frequency signal component and the second radio-frequency signal component.

15. The method of claim 8, further comprising:
  receiving in a receiving antenna, a radio-frequency debugging signal comprising the first radio-frequency signal component and the second radio-frequency signal component; and
  executing a defect detection procedure comprising:
    obtaining a digital dataset by digitizing the radio-frequency debugging signal;
    applying an inverse Fourier transform to the digital dataset to derive a reconstructed near-field representation of the transmitting antenna array, the reconstructed near-field representation indicating a signal radiation distribution of the transmitting antenna array;
    comparing the reconstructed near-field representation of the transmitting antenna array to a signal radiation reference template of the transmitting antenna array to detect at least one of a defective phase or a defective amplitude in the signal radiation distribution of the transmitting antenna array; and
    based on the at least one of the defective phase or the defective amplitude, identifying zero or more defects in at least one of the transmitting antenna array or the device-under-test coupled to the transmitting antenna array.

16. A defect detecting system comprising:
  a receiving antenna configured to receive a radio-frequency debugging signal transmitted by a transmitting antenna array to which a device-under-test is coupled, the radio-frequency debugging signal including a first radio-frequency signal component having a first signal phase and a second radio-frequency signal component having a second signal phase, the first signal phase and the second signal phase selected to provide information indicative of a signal radiation distribution of the transmitting antenna array; and
  an element defect detector coupled to the receiving antenna, the element defect detector configured to execute a defect detecting procedure, the defect detecting procedure comprising:
    obtaining a digital dataset by digitizing the radio-frequency debugging signal;
    applying a back-propagation algorithm to the digital dataset to derive a reconstructed near-field representation of the transmitting antenna array, the reconstructed near-field representation indicating the signal radiation distribution of the transmitting antenna array; and using the reconstructed near-field representation of the transmitting antenna array, identifying a defect in at least one of the transmitting antenna array or the device-under-test coupled to the transmitting antenna array.

17. The system of claim 16, wherein the device-under-test comprises:
   a driver and phase conditioning circuit;
   a controller for controlling the driver and phase conditioning circuit; and
   a debugging code sequence generator coupled to at least the controller, the debugging code sequence generator configured to generate at least a first debugging code sequence that is selected to confine two or more side lobes of the radio-frequency debugging signal inside a pre-defined cone angle of signal transmission of the radio-frequency debugging signal from the transmitting antenna array.

18. The system of claim 17, wherein the transmitting antenna array further comprises a plurality of radiating elements having a spacing $\geq \lambda/2$ between any two adjacent radiating elements, $\lambda$ representing a wavelength of the radio-frequency debugging signal transmitted by the transmitting antenna array.

19. The system of claim 17, wherein a first radiating element and a second radiating element of the transmitting antenna array are located adjacent to each other in at least one of a row or a column of the transmitting antenna array, and wherein the first debugging code sequence comprises a binary code with opposing bits of the binary code corresponding to a respective one of the first signal phase and the second signal phase.

20. The system of claim 16, wherein the back-propagation algorithm comprises at least one of an inverse Fourier transform, a convolution, a Fraunhofer propagation algorithm, a Fresnel propagation algorithm, a Rayleigh-Sommerfeld propagation algorithm, an Angular Spectrum propagation algorithm, or a partial differential equation solver.

* * * * *

UNITED STATES PATENT AND TRADEMARK OFFICE
CERTIFICATE OF CORRECTION

PATENT NO. : 10,459,021 B2
APPLICATION NO. : 15/268016
DATED : October 29, 2019
INVENTOR(S) : Gregory Steven Lee et al.

Page 1 of 1

It is certified that error appears in the above-identified patent and that said Letters Patent is hereby corrected as shown below:

In the Claims

Column 17, In Claim 11, Line 64, delete "$\geq \lambda/2$," and insert -- $\geq 2$ --, therefor.

Signed and Sealed this
Twenty-eighth Day of January, 2020

Andrei Iancu
*Director of the United States Patent and Trademark Office*